April 8, 1952 R. H. VARIAN Re. 23,479

ELECTRICAL TRANSLATING SYSTEM AND METHOD

Original Filed Oct. 11, 1937 2 SHEETS—SHEET 1

INVENTOR.
RUSSELL H. VARIAN.
BY Lippincott & Metcalf
ATTORNEYS.

April 8, 1952 R. H. VARIAN Re. 23,479

ELECTRICAL TRANSLATING SYSTEM AND METHOD

Original Filed Oct. 11, 1937 2 SHEETS—SHEET 2

INVENTOR,
RUSSELL H. VARIAN.
BY
Lippincott & Metcalf
ATTORNEYS.

Reissued Apr. 8, 1952

Re. 23,479

UNITED STATES PATENT OFFICE 23,479

ELECTRICAL TRANSLATING SYSTEM AND METHOD

Russell H. Varian, Stanford Village, Calif., assignor to the Board of Trustees of The Leland Stanford Junior University, Stanford University, Calif., a corporation of California Original No. 2,242,275, dated May 20, 1941, Serial No. 168,355, October 11, 1937. Application for reissue June 6, 1950, Serial No. 166,480

31 Claims. (Cl. 315—6)

Figure 1:
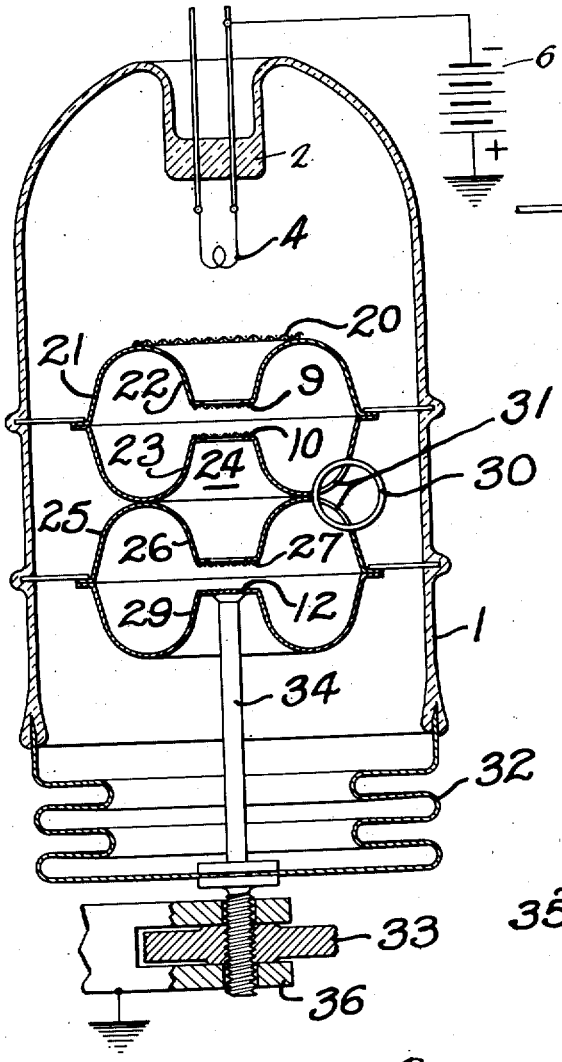

Matter enclosed in heavy brackets [ ] appears in the original patent but forms no part of this reissue specification; matter printed in italics indicates the additions made by reissue.

My invention relates to electrical translating systems and methods, and more particularly to systems and methods employing electrical discharges.

Among the objects of my invention are: To provide a new and improved method of and apparatus for controlling an electron discharge; to provide an efficient control of an electron stream at ultra-high frequencies; to provide in combination, means for producing a stream of electrons and a cavity resonator or space resonant device for controlling the electron stream to effect the concentration of the electrons thereof into groups, to provide a cavity resonator for cooperating with the grouped electron stream for abstracting ultra-high frequency energy therefrom; to provide a novel ultra-high frequency amplifier employing cavity resonators; to provide such an amplifier using cavity resonators of annular form and high power output; to provide an electron-discharge tube of high efficiency at ultra-high frequencies and including wavelengths of the order of, or below, ten centimeters; to provide an improved method of abstracting or absorbing power from an electron stream; and to provide a simple and efficient means for and method of amplifying alternating currents in the ultra-high frequencies.

My invention possesses numerous other objects and features of advantage, some of which, together with the foregoing, will be set forth in the following description of specific apparatus embodying and utilizing my novel method. It is therefore to be understood that my method is applicable to other apparatus, and that I do not limit myself, in any way, to the apparatus of the present application, as I may adopt various other apparatus embodiments, utilizing the method, within the scope of the appended claims.

Figure 3:
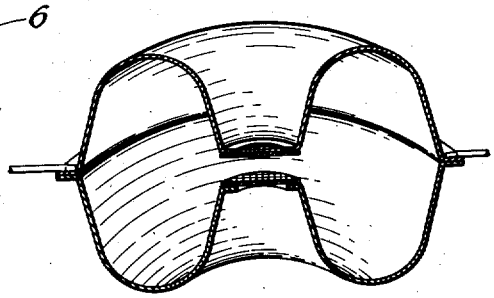
Figure 4:
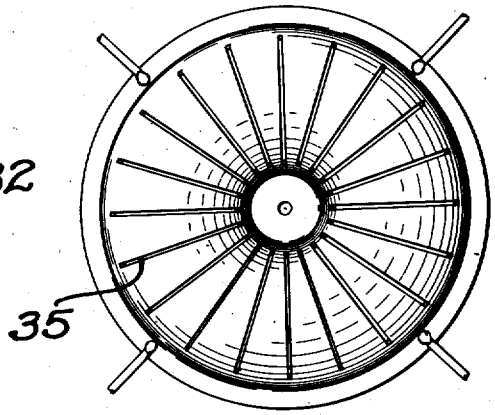
Figure 2:
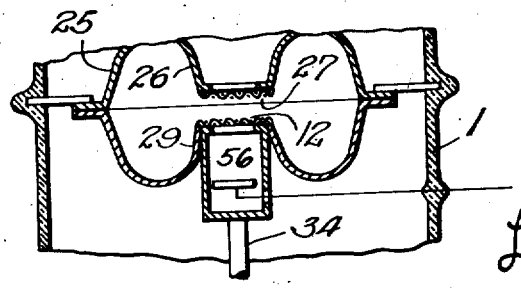
Figure 5:
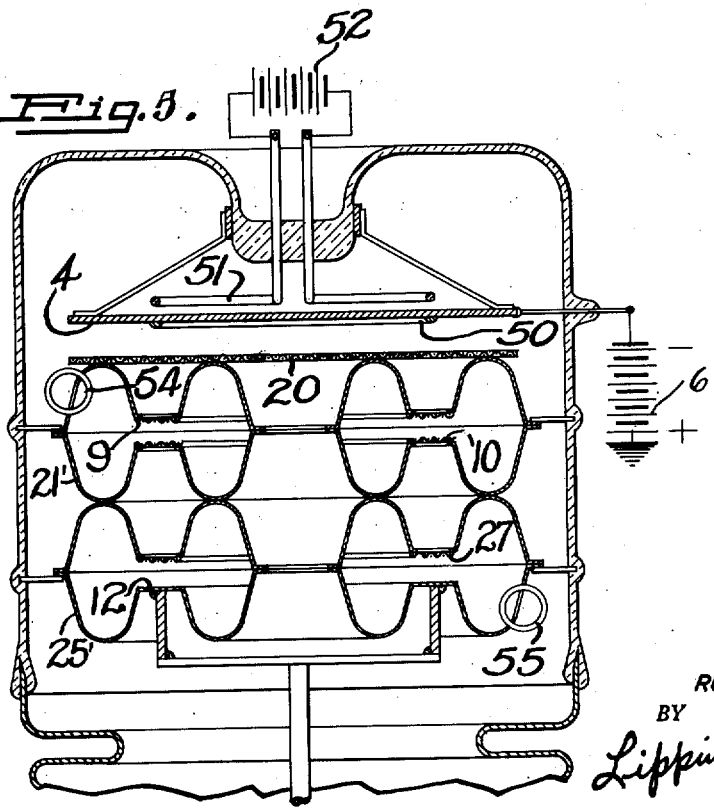

Referring to the drawings:

Fig. 1 is a view, partly in longitudinal section and partly diagrammatic, illustrating an oscillator embodying my invention; Fig. 2 is a fragmentary section of a slight modification of the structure shown in Fig. 1; Fig. 3 is a view, partly in section and partly in perspective, showing a portion of the resonant circuit utilized in the tube shown in Fig. 1; Fig. 4 is a plan showing how the toroid space-resonant circuit may be made resilient for tuning purposes; and Fig. 5 is a longitudinal sectional view of an amplifier tube embodying my invention, utilizing resonators having a relatively large power output and employing a large electron stream area.

Utilizing the principles of the present invention, I am able to build oscillating and/or amplifying tubes having a high power output at ultra-high frequencies which may be represented by wavelengths, for example, of ten centimeters or less, and I shall describe a self-oscillator or converter and an amplifier wherein all of the resonant circuits are small enough to be self-contained within a single envelope. In this respect, I employ as a basic principle for the design of the oscillating or amplifying circuits, a confined field resonator, in the form of a hollow metal internally space-resonant or tuned body.

To illustrate my invention, I have shown in the drawings a plurality of structures embodying my new method, in order that those skilled in the art may be able, from the disclosure herein, to build other apparatus following the same broad principles as claimed.

The word grid, as utilized herein, is deemed to refer to any electron-permeable electrode, irrespective of the number of apertures present, so placed as to influence electrons or to be influenced by them.

Referring directly to Fig. 1, which shows a thermionic tube or apparatus connected to control an electron stream, in accordance with my invention, an envelope 1 is provided at one end thereof with a reentrant stem 2 which supports a thermionic cathode 4. It is obvious that any of the thermionic cathode structures directly or indirectly heated, may be utilized to form the source of electrons for the tube.

Under the influence of the field between the cathode 4 and a screen or accelerating electrode 20 produced by an accelerating battery 6, the negative terminal of which is connected to the electron-source cathode 4, the electrons emitted from the cathode 4 are caused to travel therefrom in the form of a stream along a substantially straight-line path. Along this path, the electrons travel through the screen 20, into and through a cavity resonator or space-resonant device 21 of the above-described character, through a space or region 24 and through a second cavity resonator 25. The resonators 21 and 25 are electrically connected, illustrated with their outside surfaces at ground potential, the region 24 being shielded from the fields within said resonators.

Two parallel grids 9 and 10, forming part of the resonator 21, are disposed in the path of travel of the electron stream. Between these grids 9 and 10, the electrons are subjected to the action of an alternating electromagnetic field produced by oscillations within this resonator. After passing through the space-resonator 21 and through the space 24, the electrons enter the second space-resonator 25 through an anode grid 27, and travel thereafter through this space-resonator 25 to an anode or plate 12, which may be in the form of a solid wall. By reason of the nature of these resonators and their operation, the electromagnetic waves are multiply coherently reflected from the inner walls of the respective resonators. Because of their construction, shielding between the two resonant circuits of these resonators is practically perfect, and their respective alternating fields are thus completely electrically separated at the operating frequency.

The resonant alternating electromagnetic fields of these space-resonators, which comprise sustained standing waves, are contained entirely within, so as to be bounded by, the conducting walls of the respective space-resonators, frequency of the standing waves being determined by the interior dimensions of the resonators. All conduction currents are on the inner surfaces of these walls. The portion of the field of the resonator 21 that coacts with the electron stream extends between the opposed inner surfaces of the grids 9 and 10. The portion of the field of the resonator 25 that coacts with the electron stream extends between the opposed inner surfaces of the grid 27 and the anode 12. Except for the openings through the grids 9, 10 and 27, these resonators constitute substantially closed and non-radiating containers.

If desired, the anode 12 may also be permeable, as illustrated in Fig. 2. The electrons, after passing through the permeable electrode 12, may travel to a further anode 56.

The cathode structure 4 should be so designed, and the screen 20 so shaped, that the stream of electrons shall be focused into a collimated beam that does not spread excessively, notwithstanding that it is projected a considerable distance. The form of the screen 20 depends upon the physical configuration of the apparatus. Though it is connected through the frame of the apparatus to the positive terminal of the accelerating battery 6, it does not take part in the hereinafter-described cyclic operation of the system.

It is desirable, for the purpose of most efficiently practicing the invention, that the grids 9 and 10 be spaced to give an electron flight time therebetween substantially equal to or less than a half-cycle, or substantially an odd number of half-cycles, in accordance with the initial velocity of the entering electrons, and as determined by the frequency of the space-resonant device 21.

Each of the resonators 21 and 25 is shown as reentrant, as described in a copending application of [the said] *William W.* Hansen with David L. Webster, Serial No. 220,414, filed July 21, 1938, *now patent No. 2,227,372 granted December 31, 1940,* the front reentrant poles being shown at 22 and 26, and the rear reentrant poles at 23 and 29. The resonators have substantially the exterior shape, roughly, of a toroid, as indicated in Figs. 3 and 4, except for the fact that the reentrant poles do not meet at, but are truncated before reaching, the respective centers of the resonators. *Thus, the resonators are in the form of a figure of revolution about an axis through the reentrant poles.*

The grids 9, 10 and 27 may be in the form of multiple-apertured conducting members, as shown. The grids 9 and 10 are designed so as to offer as little obstruction to the passage of the electron stream as possible and are located at the inner extremities of the poles 22 and 23 of the resonator 21, and the grid 27 and the collector 12 are also located at the inner extremities of the poles 26 and 29 of the resonator 25. The grids 9, 10 and 27 serve to confine the resonator standing fields within the respective resonators. The electron stream, therefore, is projected through the pole 22 and the grid 9 before entering the resonator 21, through the grid 10 and the pole 23 after leaving it, and through the grid 27 and the pole 26 before entering the resonator 25.

Energy may be transferred to or from the electromagnetic field of a resonator of this character by means of inductive loops or capacitive elements in the field, as well as by means of a stream of electrons. In the oscillator of Fig. 1, the resonators are shown coupled together by a single coupling loop 30 that enters the respective resonators through adjacent coupling slots 31 therein. The coupling loop 30 so interconnects the two resonators that any oscillation set up in one resonator shall cause an oscillation to be set up in the other resonator having a definite phase relation with the first. The space-resonant devices 21 and 25 are thus excited and unilaterally coupled together by the stream of electrons projected through their fields. The degree of insertion of this loop into the resonators controls the bilateral coupling. The portion of the loop remaining outside may constitute a radiator or load circuit.

In an amplifier, this coupling loop 30 may, of course, be omitted, unless feed-back is desired.

Referring now to the amplifier of Fig. 5, it will first be assumed that the electrons emitted from the electron source 50 are caused by the accelerating voltage 6 to travel toward the grid 9 in the form of a beam that enters this grid with uniform velocity, so as to provide a uniform distribution in time of the electrons in the electron stream. This uniform entering velocity will hereinafter be referred to as the normal or mean velocity of the electrons. Upon passing through the grid 9, the electrons enter the space-resonant device 21', in which the before-described alternating electromagnetic field has been set up by a signal of this same frequency that it is desired to amplify. This signal may be introduced through a coupling input loop 54.

The alternating electric field thus set up in this resonator 21' by the signal results in imparting periodic or cyclical increments and decrements of energy, of the period of the field of the resonator, to the electrons entering through the grid 9 and traveling through the field, until they exit through the grid 10. According to the direction of the electric field, some of the electrons, as they exit, will have become accelerated and their velocities will thus have become increased in varying amounts; and others will have become decelerated and their velocities decreased in varying amounts. The net speed of still others of the electrons will remain unchanged; these electrons will retain their normal or mean velocity. The successive accelerations and decelerations of the electrons the velocities of which become changed are periodic, and at the natural frequency of the space-resonator 21.

The speed of a particular electron at the time that it arrives at the grid 10, therefore, may be either higher than, equal to, or lower than the said uniform or mean velocity of the stream. Some of the electrons of the stream, as they emerge from the grid 10, will have the said mean velocity of the stream, the velocities of others will be higher than this mean velocity, and the velocities of still others will be lower. The electrons will thus assume periodically or cyclically varying velocities, in synchronism with the frequency of the field of the resonator 21' as they leave the grid 10.

In the absence of other forces, the electrons will continue to travel beyond the grid 10 at whatever speed they had when they left this grid. They will thus travel through the space 24 between the grids 10 and 27 with unchanging individual velocities, but some with higher velocities and others with lower velocities than the mean velocity of the electrons. In the space 24, in other words, the said periodic increments and decrements of energy and, consequently, the relative velocities of the electrons, will be maintained substantially constant. If permitted thus to travel for a suitable time, the electrons will no longer be distributed uniformly in time, as they were when they entered the space between the grids 9 and 10. The slow electrons will not be so far from the grid 10 as they would have been if they had retained their normal velocity, and the fast electrons will similarly be farther from the grid 10 than they would have been if they had continued to travel at normal velocity.

If an electron that has been decelerated during its travel through the space between the grids 9 and 10 passes the grid 10 at one instant, followed the next instant by an electron that has become accelerated during its passage through the same space, the faster electron will gain on the slower electron during their travel toward the anode 12. A normal-velocity electron will thus, in time, catch up with those electrons, of reduced velocities, that emerged from the grid 10 before it. The electrons that leave the grid 10 later than this normal-velocity electron, with higher velocities, will similarly catch up with this normal-velocity electron. If the time of travel of the electrons in the space 24 is large compared to the period of the field of the resonator 21', therefore, it will be possible, at a particular instant of time, to find along the axis of the space 24 regions in which the electron density is somewhat increased and regions where it is somewhat diminished.

The distance between the grids 10 and 27 may be such that the electrons of mean velocity may require one or more, such as one-and-one-half or two, cycles of the frequency of the accelerating field to traverse it. In such cases, the distance traveled by the electrons will be large enough so that the electrons shall become simultaneously concentrated in the space 24 into a plurality of groups or bunches of different degrees of concentration, with a spacing determined by the frequency of the alternating field and the average velocity of the electrons. The degree of this grouping or bunching at any point is determined by the time interval elapsed since leaving the grid 10, the degree of excitation of the field between the grids 9 and 10, and the magnitude of the voltage source 6. Between successive groups, there will correspondingly be found a number of positions where there will be rarefactions in the electron distribution.

If an observer could visualize these groups of electrons between the grids 10 and 27, he would see one such group concentration travel past any point of observation for each cycle of the alternating electric field between the grids 9 and 10.

Greater increments and decrements of energy are imparted to the electrons individually while in the resonator 25' than were imparted to them in the resonator 21'. The decrements are applied to more electrons than the increments in the resonator 25'.

By utilizing these periodic changes in the electron density of the stream entering the resonator 25', it is possible to absorb energy from the successive concentrations of electrons in the bunched or grouped stream, by delivering this energy, in the form of pulses, to an alternating electric field at the natural frequency thereof. The groups can thus be made to excite the space-resonant circuit 25' of Fig. 5, if properly positioned to receive the groups, or to create or build up and maintain the alternating electric field therein. The concentrations of these electron groups passing through the space between the grid 27 and the anode 12, shown in Fig. 5, and the resonator 25 of Fig. 1, is therefore equivalent, when properly utilized, to an alternating current.

The time of arrival of a group at grit 27 is substantially the time of arrival of the normal or mean-velocity electrons. If it requires a half-cycle for the groups to traverse the space between the grid 27 and the anode 12, for example, and the group is to deliver maximum energy, it should arrive at the grid 27 when the field between the grid 27 and the anode 12 is zero and starting to oppose the motion of the electrons.

The manner in which amplification of the signal is obtained will now be described.

It will be assumed that the tuned element 25' is adjusted so that it resonates at the frequency of the signal voltage. The electrons, when they reach a plane, say, half-way between the grid 27 and the anode 12, therefore, have a degree of bunching or grouping determined by the voltage of the signal source acting on the resonant element 21' through the loop 54. If the alternating field between the grid 27 and the anode 12 were absolutely zero, the groups of electrons would do no work to excite the resonant circuit 25'. The condition of no field between the grid 27 and the anode 12 never, however, exists, in practice. There is always actually at least a minute field, caused by thermal agitation of the electrons in the resonant circuit 25'. This minute field, since it originates from random motions, will take on all possible phases with respect to the phase of arrival of the bunches of electrons in the interspace between the grid 27 and the anode 12. If this minute field of the resonator 25' happens to be oscillating in such phase that it opposes the motion of the larger groups of electrons during their passage from the grid 27 to the anode 12, these groups of electrons will become slowed down. The kinetic energy thus absorbed from these electron groups will become stored as energy of oscillation in the resonator 25'. The field will, therefore, become enhanced. This increase in the strength of the oscillating field in the resonator 25' will then oppose more strongly the subsequent groups of electrons, resulting in still further enhancing the strength of the field and the magnitude of the oscillations in the resonator 25' until the circuit losses of the resonator 25' become equal to the energy supplied to the resonator 25' by the grouped electron beam. In an efficient resonator 25', the losses will not equal the energy supplied by the groups until the field in the resonator 25' is much greater than the field producing the grouping.

The field will be directed half the time so as to increase the energy of any electron passing therethrough at such time. Some of the energy in the resonator 25′ will thus be returned to the electrons moving along between the bunches, but as these electrons are less numerous, and as they receive an increase in energy per electron that is substantially the same as the decrease in energy per electron suffered by the groups or bunches, the energy lost to the electrons by the field will be less than the energy gained from the electrons by the field. A substantial portion of the energy of a group may in this way be given up to the field of the second space-resonator 25′.

On the other hand, a negligible amount of energy is given to the electron stream by the signal source 54 if the maximum cyclic voltage developed by the signal between the grids 9 and 10 of the resonator 21′ is sufficiently small compared with the electron-beam accelerating voltage 6. Even though this signal modulating voltage between the grids 9 and 10 is extremely small compared with that of the source 6, the electrons will be able to group themselves to some extent in the space beyond the grid 10, as already described, despite the negligible energy required to accomplish this effect.

Since the space-resonant devices 21′ and 25′ have very high ratios of stored energy to loss of energy per cycle, and the resonance frequencies in different modes of motion of the resonators used are generally not proportional to integers and since the grouping of the electrons in the beam is a repeating function which must have all its harmonics equal to integers, only one mode will have a relatively strong excitation.

The frequency excited in the resonant circuit 25′ is not necessarily, however, the same as that of the resonator 21′. Analysis shows that these groups contain an extremely high component of harmonic frequencies bearing an integral relation to the fundamental frequency. The field of the space-resonant device 25′ has resonant harmonic or multiple frequencies that are not integral multiples of the fundamental exciting frequency of the alternating-current field of the grouping circuit 21′. It is thus possible to absorb from the groups oscillatory energy of one of the harmonic frequencies equal to a multiple of the frequency of the periodically varying velocities imparted to the electrons in the resonator 21′.

In the foregoing discussion, it has been assumed, merely for convenience of explanation, that the time spent by the electrons in the interspace between the grids 9 and 10 is the same regardless of whether they are being accelerated or decelerated. This assumption is approximately fulfilled if the change of velocity between the grids 9 and 10 is small compared with the normal velocity with which the electrons pass through the grid 9. Cases may exist, in practice, however, where the relative time spent between the grids 9 and 10 by different electrons may become important. This is more likely to occur in an oscillator than an amplifier.

The invention provides also a regenerative amplifier. As has previously been described an oscillatory field between the grids 9 and 10 will produce electron grouping that may produce an oscillatory field between the grid 27 and the anode 12 greater than, or amplified with respect to, that existing between the grids 9 and 10. It has also been pointed out that if sufficient energy is returned from the resonant circuit 25′ to the resonant circuit 21′, sustained oscillations will result. If the energy returned from the resonant circuit 25′ to the resonant circuit 21′ is almost, but not quite, sufficient to sustain oscillations, however, the losses in the resonant circuit 21′ will be almost cancelled by the said returned energy. If a very small external source of oscillating energy is supplied to the resonant circuit 21′, therefore, a relatively large amplitude of oscillations will be produced between the grids 9 and 10.

In the case of an amplifier in which there is no feedback between the electron-grouping circuit and the circuit absorbing energy from the groups, the latter circuit will automatically take on that phase relation to the incoming groups that will extract power from the incoming groups. In the case of an oscillator, however, it is desirable that the electron-grouping circuit should deliver the groups to the circuit absorbing energy from the groups in the proper phase for the latter circuit to extract the maximum of energy. By changing the velocity of the electrons in the space between the electron-grouping circuit and the energy-absorbing circuit, the phase, on arrival of the groups in the energy-absorbing circuit, can be given any desired value. Since any phase whatever can be obtained, it is always relatively easy to obtain the proper phase by adjusting the flight time between the energy-grouping circuit and the energy-absorbing circuit by changing the velocity of the electrons. This may be done, for example, by changing the potential of the battery 6.

In a regenerative amplifier, similarly, the phase of the energy fed back to the electron-grouping circuit from the energy-absorbing circuit and, therefore, the effective regeneration, can be controlled by varying the flight time of the electrons between these circuits.

The shorter the flight time between the grids 10 and 27, the greater must be the difference in velocity between the accelerated and the retarded electrons of the group, in order that the fast electrons, that follow the normal electrons, taken as the center of the group, may overtake these normal electrons by the time that they enter the space between the grid 27 and the anode 12. This, of course, requires that the alternating voltage between the grids 9 and 10 must be increased to compensate for the shortening of the space between the grids 10 and 27. If the space between the grids 10 and 27 is shortened too much, however, the difference in energy of the accelerated electrons and of the retarded electrons will be a large part of the energy of the normal electrons in the group. It will then become impossible for the field between the grid 27 and the anode 12 to extract all the kinetic energy of the electrons of the group; because, if this field is made strong enough to extract all the energy of the faster electrons of the group, it will be so strong as to stop and turn back the slower electrons of the group, and these electrons, after spending considerably more time between the grid 27 and the anode 12, will eventually strike the anode 12 with a relatively large energy, which will be dissipated as heat at the anode 12. If, on the other hand, the field between the grid 27 and the anode 12 is reduced to a point at which it will not turn back the slowest electrons, it will not extract the full energy of the fastest electrons before they strike the anode 12, and they will dissipate a good deal of their energy as heat in the anode 12. The free-flight distance between the grids 10 and 27 cannot, therefore, be shortened indefinitely without sacrificing the efficiency of extraction of energy from the groups.

Although the above considerations are important in the operation of the ultra-high frequency oscillator to be described in more detail presently, they apply also to an amplifier; the conditions for grouping in an amplifier, acting as a frequency doubler, are roughly the same as those in an oscillator. Since the mutual conductance of the amplifiers here described may be some hundreds of micromhos, and the effective shunt impedances of the resonators described are of the order of a megohm, high amplifications are easily obtainable on the fundamental frequency of the beam modulation. Since the harmonic content of the modulated beam is surprisingly high, quite appreciable amplification of a harmonic may also be obtained in the same structure generating harmonics.

Returning, now, to Fig. 1, the oscillator illustrated therein is comparable to the case where the amplifier of Fig. 5 is rearranged so that a feed back signal is used to establish the field between the grids of the tuned circuit 21, as will now be explained. The existence of an alternating field is postulated between the grids 9 and 10, owing to oscillations at the natural frequency of the resonator 21.

If the device is to act as a self-excited oscillator, the oscillatory field must be automatically built up by the action of the electron stream to a high level from a very minute transient value, such as that supplied by thermal agitation of electrons between the grids 9 and 10, or by other small departures from uniformity in the velocity or the density of the electron stream. This field will produce a minute degree of electron grouping by the process above described between the grid 27 and the anode 12. As has also been described, the resonant circuit 25 will now automatically have built up in its oscillations in such phase as to extract energy from any group of electrons appearing with the proper frequency between the grid 27 and the anode 12. If a portion of the energy in the resonant circuit 25 is transferred by feed-back to the resonant circuit 21, as by means of the coupling loop 30, in such phase as to enhance the minute oscillations between the grids 9 and 10 originally postulated, this enhancement of the oscillations will produce an increased degree of electron grouping between the grid 27 and the anode 12 which, in turn, will increase the oscillations in the resonator 25. The initial faint oscillations in the resonator 21 will, therefore, become increased, thus still further increasing the grouping. This cyclic process may continue to produce stronger and stronger oscillations until a steady state of oscillation is achieved. To this end, the grouping produced by the oscillations between the grids 9 and 10 should provide enough energy to the circuit consisting of the anode 12, the grid 27 and the resonant circuit 25 so that the energy returned from the resonant circuit 25 to the resonant circuit 21 shall be great enough to supply the losses in the resonant circuit 21 and the grids 9 and 10, and also still further to increase the oscillation in the resonant circuit 21. After the oscillator has reached the stage of full oscillation, the energy of the grouped electrons is largely absorbed by the field in the space between the grid 27 and the anode 12.

Since the amount of energy delivered to the resonant element 25 by the bunching caused by a given field strength between the grids 9 and 10 is proportional to the current in the electron beam, the above conditions for the setting up of oscillations may be satisfied only if the current through the device exceeds a certain value. This minimum current that will result in oscillation, therefore, depends largely upon the losses involved in maintaining the oscillations between the grids 9 and 10 and between the grid 27 and the anode 12.

One actual preferred construction of the confined field resonators 21 and 25 is shown in Figs. 3 and 4, and in Fig. 4 I have shown radial slots 35 in the resonator wall, and this is for the purpose of making the resonator slightly resilient so that the anode resonator 25 may be tuned to the grid resonator 21, i. e., by changing the spacing between anode grid 27 and anode 12. This is accomplished within the tube in one manner by sealing to the end of the glass envelope 1 a metal bellows 32, and to the end of this bellows a tuning rod 34 which may be moved to exert pressure against anode 12 by micrometer nut 33 bearing against stationary bearings 36. The slots 35 in resonator 25 may be very narrow in which case they will not radiate appreciable amounts of energy. If they are of considerable width, the radiated power may be comparable with the total power of the oscillator.

It is interesting to note that in the type of tube just above described, the only exterior connections necessary are the connections of battery 6 to the cathode 4 and the resonators. All other connections are within the tube.

I have also found that if there is too great a scattering of the electrons in their passage from the first grid to the anode, that magnetic or electrostatic focusing can be readily applied to ensure that all electrons passing the first grid will either strike or pass through the third grid immediately in front of the anode 12. I have further found that in order to prevent too great an obstruction and scattering of the beam during the passage through the grids, that the first grids may be made of the slat type, with wires running in only one direction, whereas the third grid may have its wires running at right angles thereto.

Utilizing the oscillator above described, I have been able to produce a large amount of power at wavelengths of the order of or below ten centimeters, and in this regard the size of the resonators for these low frequencies are such that they are readily included within the tube envelope. Experiments and calculations show that the resonant wavelengths of metal resonators such as have been described are about 2.5 times the diameter thereof.

The practical use of an amplifier such as I have descrbied is extremely simple. The anode circuit 25 may be readily tuned to the grid circuit 21 simply by varying the distance between the anode 12 and the anode grid 27, through the medium of the nut 33. A corresponding deformation of the field of the resonator 21 may be effected to adjust the frequency thereof.

I have therefore provided an amplifier, as well as an oscillator, operating at ultra-high frequencies, where none of the circuits carrying high frequencies, except the circuit carrying the input signal, is outside of the tube, where all exterior surfaces of the resonant-circuit members are at ground potential, wherein all the resonant circuits are completely contained within a single tube envelope, and wherein the resonant circuits may be completely shielded from each other and from all other structures.

It should also be pointed out that there are many other forms of resonators and confined field resonators that may be utilized to practice my invention, and the reentrant type of confined field resonator has been described herein as an illustration only of one preferred circuit embodying my invention.

For example, Fig. 5 shows a tube wherein there is a large area to the cross section of the electron stream, with ultra high frequency resonators 21' and 25' of special design. Here, the resonators 21' and 25' are of true doughnut shape, except that in this case the reentrant portions are annular and carry annular grids 9, 10 and 27 and an annular anode 12. The cathode, in this case, may be constructed in any convenient manner to give a beam of annular cross section corresponding in diameter to the diameter of the annular grids, and one way in which this type of beam may be provided is by making the cathode 4 a unipotential sheet and depositing on one side thereof a ring 50 of electron emitting material. The cathode 4 may be conveniently heated by a heater coil 51, energized by heater source 52. When the cathode 4 is heated, emission will take place only from the ring shaped deposit of emitting material, and the electrons will be drawn by screen 20 into first grid 9.

By thus forming the resonators, I am able to maintain an extremely high fundamental frequency of the resonator, and yet provide a large area for an electron stream, and am thus able to provide a device of extreme high power at ultra high frequencies.

I claim:

[1. In a device of the character described, the combination of means producing an electron beam and a substantially closed conducting member providing a chamber constituting a resonant circuit having a standing electromagnetic field therewithin, said member having electron-permeable walls through which the electron beam passes for control purposes.]

[2. Apparatus of the character described having, in combination, means for creating a confined standing electromagnetic field having an electric field portion extending in a predetermined region, means for confining the electric field portion to the region, and means for passing an electron stream through the electric field portion to cause the electrons to assume periodically varying velocities and thereafter past the field to cause the electrons to become concentrated in groups.]

[3. Apparatus of the character described having, in combination, means for creating an electron stream of substantially uniform velocity, a space-resonant device, means for creating a standing electro-magnetic field within the space-resonant device, the exterior surface of said device being free of alternating potentials of the frequency of operation of the apparatus, and means for directing the electron stream through the field of the space-resonant device to cause the electrons to assume periodically varying velocities due to the action of the internal field therein.]

[4. Apparatus of the character described having, in combination, a plurality of spaced resonators, and means for passing electrons through the resonators, one of the resonators having a confined electromagnetic field.]

5. Apparatus of the character described having, in combination, means for creating an electron stream of substantially uniform velocity, means for directing the stream through an alternating electric field to cause the electrons to assume periodically varying velocities and past the field to cause the electrons to become concentrated in groups, a cavity resonator for absorbing energy from the electrons, and means for shielding the field from the energy-absorbing means.

6. Apparatus of the character described having, in combination, means for creating an electron stream having the electrons thereof concentrated in groups, a space-resonant device, and means for absorbing the energy of the groups in the space-resonant device.

7. Apparatus of the character described having, in combination, means for creating an electron stream having the electrons thereof concentrated in groups, a space-resonant device, means for absorbing the energy of the groups in the space-resonant device, and means for adjusting the space-resonant device as to frequency.

8. Apparatus of the character described having, in combination, means for creating an electron stream, means for causing the electrons of the stream to become concentrated in groups, and means comprising a space-resonant device for absorbing energy from the groups.

9. Apparatus of the character described having, in combination, means for creating an electron stream, means for periodically varying the velocity of the electrons of the stream and for causing the electrons of the stream thereafter to become concentrated in groups, and means for absorbing energy from the groups, one of the second-named and third-named means comprising a space-resonant device.

10. Apparatus of the character described having, in combination, means for creating an electron stream, means comprising a space-resonant device for causing the electrons of the stream to become concentrated in groups, and means comprising a space-resonant device for absorbing energy from the groups.

11. Apparatus of the character described having, in combination, a space-resonant device, means for producing a grouped electron stream for traversing the space-resonant device, and means comprising the grouped stream for creating an alternating electromagnetic field in the space-resonant device to absorb energy from the stream.

[12. Apparatus of the character described having, in combination, means for creating an electron stream, means comprising a space-resonant device for periodically varying the velocity of the electrons of the stream, and means for adjusting the space-resonant device to adjust the period of the periodic variation of the said velocity.]

13. Apparatus of the character described having, in combination, two spaced space-resonant devices, means for supplying energy to one of the space-resonant devices, means for creating an electron stream, and means for passing the electrons of the stream through one of the space-resonant devices to impart periodically varying velocities to the electrons of the stream and for thereafter passing the electrons through the space between the space-resonant devices and through the second space-resonant device to deliver the energy of the electrons to the second space-resonant device, one of the space-resonant devices being adjustable.

14. Apparatus of the character described having, in combination, means for producing a stream of electrons, two internally resonant hollow bodies each having an opening, an apertured conducting member closing each opening, and means for projecting the stream of electrons through one of the conducting members into and through one of the hollow bodies to produce cyclic changes in the velocity of the electrons in the stream and for projecting the stream of electrons through the other conducting member into and through the other body to excite electromagnetic waves in the said other body.

15. Apparatus of the character described having, in combination, means for producing a stream of electrons, two internally resonant hollow bodies each having a reentrant pole, and means for projecting the stream of electrons through one of the reentrant poles into and through one of the hollow bodies to produce cyclic changes in the velocity of the electrons in the stream and for thereafter projecting the stream of electrons through the other reentrant pole into and through the other body to excite electromagnetic waves in the said other body.

16. Apparatus of the character described having, in combination, means for producing a stream of electrons, two internally resonant hollow bodies each having a reentrant pole provided with an open extremity inside the corresponding hollow body, a multiple-apertured conducting member closing each extremity, and means for projecting the stream of electrons through one of the conducting members into and through one of the hollow bodies to produce cyclic changes in the velocity of the electrons in the stream and for thereafter projecting the stream of electrons through the other conducting member into and through the other body to excite electromagnetic waves in said other body.

[17. Apparatus of the character described having, in combination, means for producing a stream of electrons, an internally resonant hollow body having a reentrant pole, and means for projecting the stream of electrons through the space within said body between said reentrant pole and the opposite wall of said body.]

[18. Apparatus of the character described comprising an internally resonant hollow body having a reentrant pole provided with an opening, and a multiple-apertured conducting member closing the opening.]

19. Apparatus of the character described comprising an internally resonant hollow body comprising a pair of radially spaced annular substantially concentric toroidal sections separated by an annular reentrant pole.

20. Apparatus of the character described comprising an internally resonant hollow body comprising enlarged annular substantially concentric toroidal sections separated by an annular reentrant pole provided with an opening, and a multiple-apertured conducting member closing the opening.

21. A resonator, comprising a hollow substantially closed conducting body of the shape of a toroid, having an annular apertured reentrant portion, and means for setting up standing electromagnetic waves therein.

22. In apparatus of the character described, a toroidal section consisting of two lobes connected by a narrow isthmus, and means for projecting electrons across said isthmus.

23. In apparatus of the character described, means for producing a stream of electrons of annular cross section, an apertured annular cavity resonator, and means for projecting the stream of electrons into said cavity resonator.

*24. Electron discharge apparatus comprising means for forming a beam of electrons directed along an axis, a plurality of spaced cavity resonators aligned along said axis, each of said resonators defining a gap for an intense high frequency electric field along said axis, the gaps of the first and second resonators traversed by said electron beam being separated by a distance appreciably greater than the dimension of either gap, and means for introducing an electromagnetic signal coupled to the first of said resonators which is traversed by said electron beam, whereby a confined ultra high frequency electromagnetic field is developed in said first of said resonators.*

*25. Electron discharge apparatus as defined in claim 24, wherein said electron beam forming means includes a cathode in the proximity of but separate from the first cavity resonator.*

*26. In combination, a plurality of cavity resonators having electron-permeable portions located along a common axis, means for forming a substantially collimated beam of electrons and for directing said electrons through the electron-permeable portions of said resonators along said axis, and means for introducing an ultra-high-frequency electromagnetic signal coupled to the first of said resonators which is traversed by said electron beam, whereby a confined ultra high frequency electromagnetic field is developed in said first of said resonators.*

*27. The apparatus of claim 26, wherein each of said electron-permeable portions comprises a pair of grids located in opposed portions of said resonators and wherein the transit time for the electrons passing between each pair of grids is less than one-half the resonant period of the resonator in which the grids are located.*

*28. The apparatus of claim 26, wherein said plural resonators are tuned to resonance at substantially the same frequency.*

*29. The apparatus of claim 26, wherein the last resonator traversed by said electron beam is resonant at substantially a harmonic of the resonant frequency of the first resonator traversed by said electron beam.*

*30. The apparatus of claim 26, wherein at least one of said cavity resonators includes a movable portion for varying the resonant frequency thereof.*

*31. The apparatus of claim 26, wherein the space along said axis between said resonators which is traversed by said beam is shielded from external sources of electromagnetic energy.*

*32. In combination, a pair of cavity resonators having electron-permeable portions located along a common axis, means for forming a substantially collimated beam of electrons and for directing said electrons through said resonators along said axis, and means for introducing an ultra-high-frequency electromagnetic signal coupled to the first of said resonators traversed by said electron beam whereby a confined ultra high frequency electromagnetic field is developed in said first of said resonators to velocity modulate the electrons of said beam, the second of said resonators traversed by said electron beam being positioned along said axis at the location at which the velocity-modulated electrons of said beam attain substantially maximum bunching.*

*33. Electron discharge apparatus comprising*

*means for creating an electron stream along an axis, means for periodically varying the velocity of the electrons of the stream and for causing the electrons of the stream thereafter to become concentrated in groups, and means for absorbing energy from the groups, one of the second-named and third-named means comprising a cavity resonator in the form of a figure of revolution about said axis.*

*34. The apparatus of claim 33, wherein said cavity resonator has a reentrant pole coaxial with said axis.*

*35. In combination, a hallow cavity resonator having electron-permeable portions in opposed walls thereof, means for producing an electron stream having the electrons thereof concentrated in groups, and means for projecting said grouped electron stream along an axis through the electron-permeable portions of said cavity resonator, whereby energy of the grouped electron stream is absorbed in the cavity resonator.*

*36. The apparatus of claim 35, wherein said cavity resonator is in the form of a figure of revolution about said axis.*

*37. Electron discharge apparatus comprising*

*a cavity resonator having an electron-permeable portion and a reentrant portion coaxial therewith, means for producing a stream of electrons, modulating apparatus for causing the electrons of the stream to become concentrated in groups, and means for projecting said stream of grouped electrons through the electron-permeable portion of said cavity resonator, whereby the cavity resonator absorbs energy from the groups of electrons.*

*38. The apparatus of claim 37, wherein the transit time for the electrons passing through said cavity resonator is appreciably less than the resonant period of the cavity resonator.*

RUSSELL H. VARIAN.

REFERENCES CITED

The following references are of record in the file of this patent or the original patent:

UNITED STATES PATENTS

| Number | Name | Date |
|---|---|---|
| 2,157,952 | Dallenbach | May 9, 1939 |
| 2,167,201 | Dallenbach | July 25, 1939 |